United States Patent [19]

Wan

[11] Patent Number: 4,567,849
[45] Date of Patent: Feb. 4, 1986

[54] DIPPING LIQUID PHASE EPITAXY FOR HGCDTE

[75] Inventor: Chang-Feng Wan, Plano, Tex.

[73] Assignee: Texas Instruments Incorporated, Dallas, Tex.

[21] Appl. No.: 607,484

[22] Filed: May 7, 1984

Related U.S. Application Data

[62] Division of Ser. No. 326,301, Dec. 1, 1981, Pat. No. 4,474,640.

[51] Int. Cl.⁴ .................. B05C 3/10; H01L 21/208
[52] U.S. Cl. ............................ 118/667; 118/425; 118/426; 422/258; 374/11; 374/12; 374/22
[58] Field of Search ............... 374/45, 112, 10, 11, 374/12, 25; 156/601; 422/106, 109, 246, 248, 260, 258; 118/667, 423, 425, 426

[56] References Cited

U.S. PATENT DOCUMENTS

| | | | |
|---|---|---|---|
| 1,285,920 | 11/1918 | Brown | 374/10 |
| 3,283,560 | 11/1966 | Harden et al. | 374/12 |
| 3,303,689 | 2/1967 | Paulik et al. | 374/12 |
| 3,447,358 | 6/1969 | Crespin et al. | 374/16 |
| 3,514,993 | 6/1970 | Simpson | 374/16 |
| 3,648,653 | 3/1972 | Vehse | 118/425 X |
| 3,677,064 | 7/1972 | Simpson | 374/25 |
| 3,858,551 | 1/1975 | Kobayasi | 118/426 |
| 3,875,788 | 4/1975 | Mills | 374/10 X |
| 3,903,841 | 9/1975 | Peters | 118/50 |
| 4,096,024 | 6/1978 | Dusserre et al. | 156/601 |
| 4,354,453 | 10/1982 | Koike et al. | 118/426 |

FOREIGN PATENT DOCUMENTS 10244  1/1982  Japan ......................... 422/246

Primary Examiner—Daniel M. Yasich
Attorney, Agent, or Firm—Robert Groover; James T. Comfort; Melvin Sharp

[57] ABSTRACT

For HgCdTe liquid phase epitaxy (LPE), in situ differential thermal analysis apparatus is used to precisely monitor the liquidus temperature of each HgCdTe melt. The neutral body, e.g. a slug of copper enclosed in a silica ampoule, is placed near the LPE reactor in a furnace. During heating or cooling, differential sensing of a pair of thermocouples (in the melt and in the neutral body) will show an accelerated change at transformation points, since at these points the temperature of the melt will be changed by the energy of the physical change, while that of the neutral body remains subject only to passive heat transfer. Thus, the actual liquidus temperature of each melt can be measured with extreme precision, and isothermal or programmed cooling methods of LPE can be precisely and reliably controlled under production conditions.

15 Claims, 5 Drawing Figures

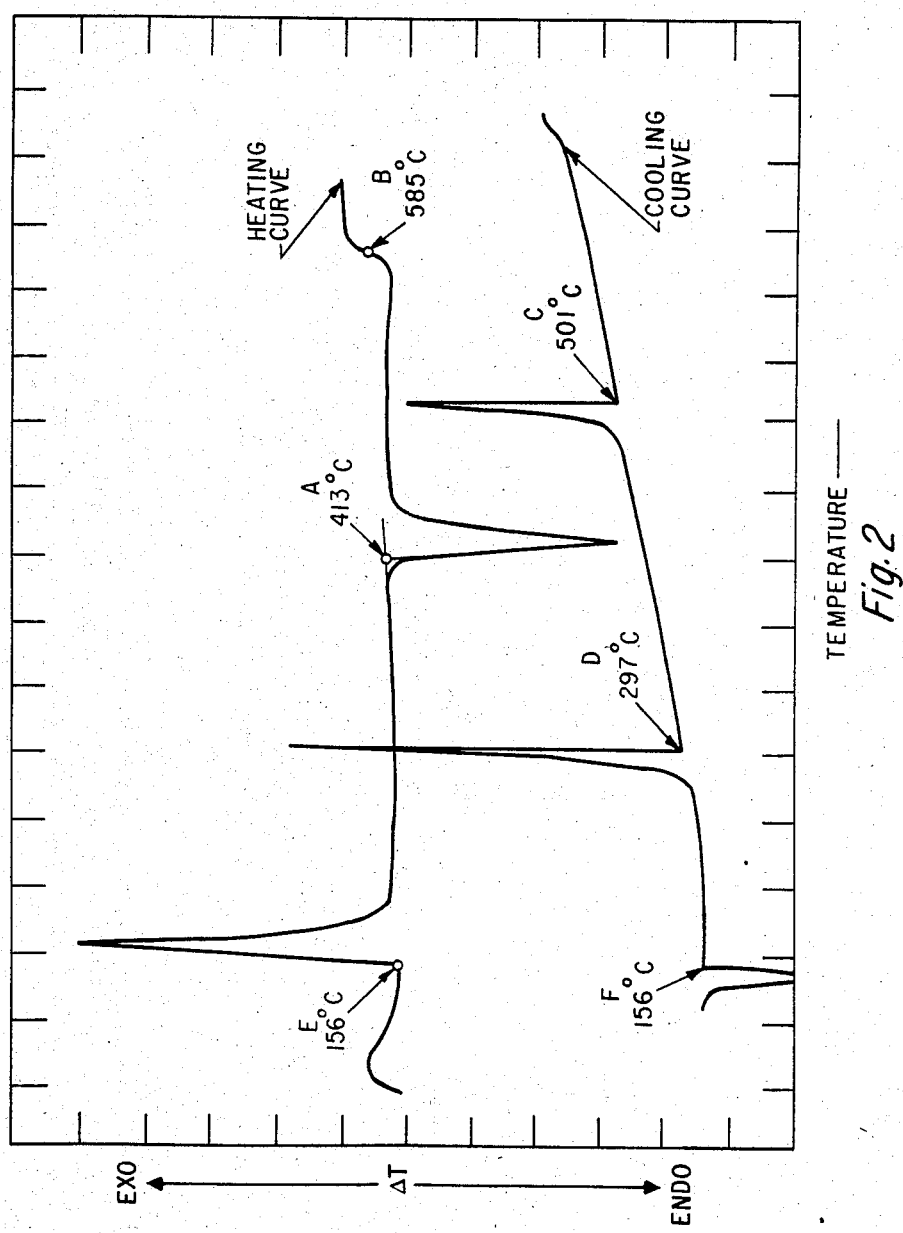

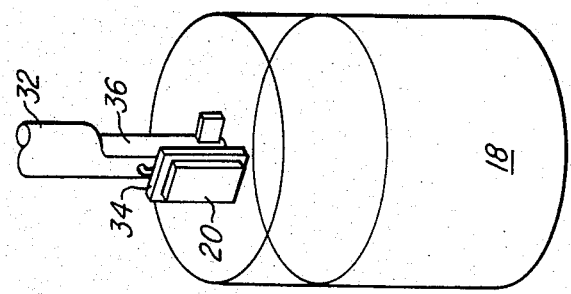
Fig. 3c WITHDRAWAL
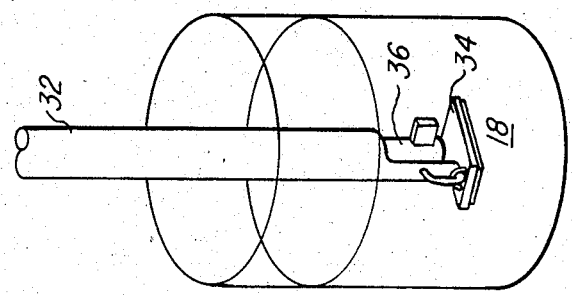
Fig. 3b LPE GROWTH
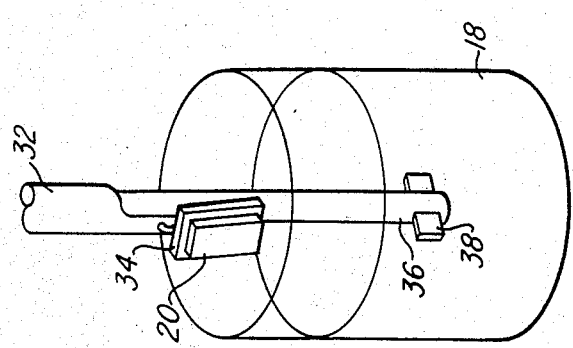
Fig. 3a MELT HOMOGENIZATION

DIPPING LIQUID PHASE EPITAXY FOR HGCDTE

This is a division of application Ser. No. 326,301, filed Dec. 1, 1981 now U.S. Pat. No. 4,474,640.

BACKGROUND OF THE INVENTION

The present invention relates to a improved method of HgCdTe liquid phase epitaxy (LPE).

"HgCdTe" is used generically to refer to the family of $Hg_{1-x}Cd_x$ Te alloys. HgCdTe is an exceedingly important material for infrared detection and imaging applications, since its band gap can be arbitrarily selected to be as small as desired (by varying the alloy composition). However, HgCdTe is a very difficult material to fabricate, for two major reasons: first, the partial pressure of mercury at temperatures of interest for HgCdTe crystal growth or LPE is so high that out-gassing of mercury, and consequent loss of stoichiometry, is a great hazard. Second, HgCdTe permits freezing out of numerous successively different fractions having different alloy compositions at only slightly different temperatures (incongruent solidification). Since any variation in composition alters the desired electronic properties, extremely precise control of the melt temperature during liquid phase epitaxy is necessary. In particular, the degree of supercooling used must be precisely controlled, since excessive supercooling may induce solidification of undesired alloys. A meltback step, prior to deposition of the desired alloy, is often required to remove the seeds of unwanted alloys previously deposited. This step also imposes stringent temperature - control requirements on any practical LPE process. The present invention is specifically aimed at solving these latter problems.

In the prior art, attempts have been made to determine the liquidus temperature of HgCdTe alloys by sealing a small sample of the alloy in a fused-silica ampoule, and then performing differential thermal analysis (DTA) with respect to a neutral body. The liquidus temperatures thus measured were used to attempt to determine the growth temperature for HgCdTe LPE in a subsequent production run. However, a crucial disadvantage of this indirect method is that the solution in the reactor may not possess the same liquidus temperature as that of the specimen sealed in the small ampoule, because as noted above, composition changes due to mercury vaporization are a constant source of uncertainty in HgCdTe. Thus, this indirect technique does not actually measure the true liquidus temperature of the melt, and therefore does not provide a sufficiently reliable technique for precise production control.

Applicants also note the following publications on HgCdTe properties and LPE, which are hereby incorporated by reference:

Long and Schmit, "Mercury-Cadmium Telluride and Closely Related Alloys," in 5 *Semiconductors and Semimetals* 175 (ed. R. Willardson and A. Beer, 1970);

Wang et al., "Liquid Phase Growth of HgCdTe Epitaxial Layers," 127 *J. Electrochem. Soc.: Solid- State Science* 175 (1980);

Mroczkowski and Vydyanath, "Liquid Phase Epitaxial Growth of $(Hg_{1-x}Cd_x)$ Te from Tellurium-Rich Solutions Using a Closed Tube Tipping Technique," 128 *J. Electrochem. Soc.: Solid-State Science* 655 (1981);

Harman, "Liquidus Isotherms, Solidus Lines and LPE Growth, in the Te-Rich Corner of the Hg-Cd-Te system," 9 *J. Electronic Materials* 945 (1980), and Bowers et al., "Comparison at $Hg_{0.6}Cd_{0.4}$ Te LPE Layer Growth from Te-, Hg-, and HgTe-Rich Solutions," 27 *IEEE Trans'ns on Electron Devices* 52 (Jan. 1980).

Thus, it is an object of the present invention to provide a method for continuously and precisely monitoring the temperature of a high-temperature liquid mixture while in a furnace.

It is a further object of the present invention to provide a method for continually and precisely monitoring the temperature of an HgCdTe melt while in a furnace.

It is a further object of the present invention to provide a method for continually and precisely monitoring the temperature of an HgCdTe melt during liquid phase epitaxy.

It is a further object of the present invention to provide an improved method for liquid phase epitaxy of electronic materials having incongruent solidification.

It is a further object of the present invention to provide a method for reliably and uniformly controlled liquid phase epitaxy of HgCdTe.

SUMMARY OF THE INVENTION

An improved LPE process for HgCdTe is provided. Adjacent to the sealed HgCdTe LPE reactor in the furnace is placed a neutral body having approximately the same mass, size, and specific heat. A differentially sensed pair of thermocouples is used: one with a hot junction in the neutral body, and the other in the specimen. Since the size and specific heat of the HgCdTe reactor and of the neutral body are approximately equal, the temperature difference between the two will be small, except at a transformation point of the HgCdTe melt, and variations in the rate of heating and cooling will not affect differential temperature measurements between the two bodies.

When a transformation point of the HgCdTe melt is reached during heating, the uniform drop in temperature of the melt is temporarily arrested (if the transformation is endothermic), whereas the temperature of the neutral body continues to rise with practically no interruption. Minor transformation points are thereby easily detected, since at a transformation point, the temperature difference between the LPE reactor and the neutral body will abruptly begin to change.

In the presently preferred embodiment, extremely slow programmed cooling is used for LPE. The substrate is immersed in the melt at about 1 degree C. above the liquidus temperature and then cooled, at about 0.02 degrees C./min, down to 2 degrees C. below the liquidus. The present invention permits precise detection of the liquidus temperature of the actual melt, as is required to practice this method on HgCdTe.

According to the present invention, there is provided a method for controlling crystal growth of a desired material, comprising the steps of:

providing a reactor to contain a melt of said desired material;

providing a neutral body;

furnace heating said neutral body and said reactor in mutual proximity;

differentially sensing the temperature difference between said neutral body and said melt;

identifying the liquidus temperature of said melt at a sharp change in the temperature difference detected by said differential sensing step; and cooling said melt at a desired rate to a desired temperature below said liquidus temperature, to effect a desired crystal growth sequence.

BRIEF DESCRIPTION OF THE DRAWINGS

The present invention will now be discussed in greater detail with reference to the accompanying drawings, wherein:

FIG. 2 shows a sample differential thermal analysis (DTA) plot of a HgCdTe melt, with reference to an indium neutral body; and FIGS. 3(a) to 3(c) show the operation of the substrate holder during LPE growth.

DESCRIPTION OF THE PREFERRED EMBODIMENTS

Figure 1:
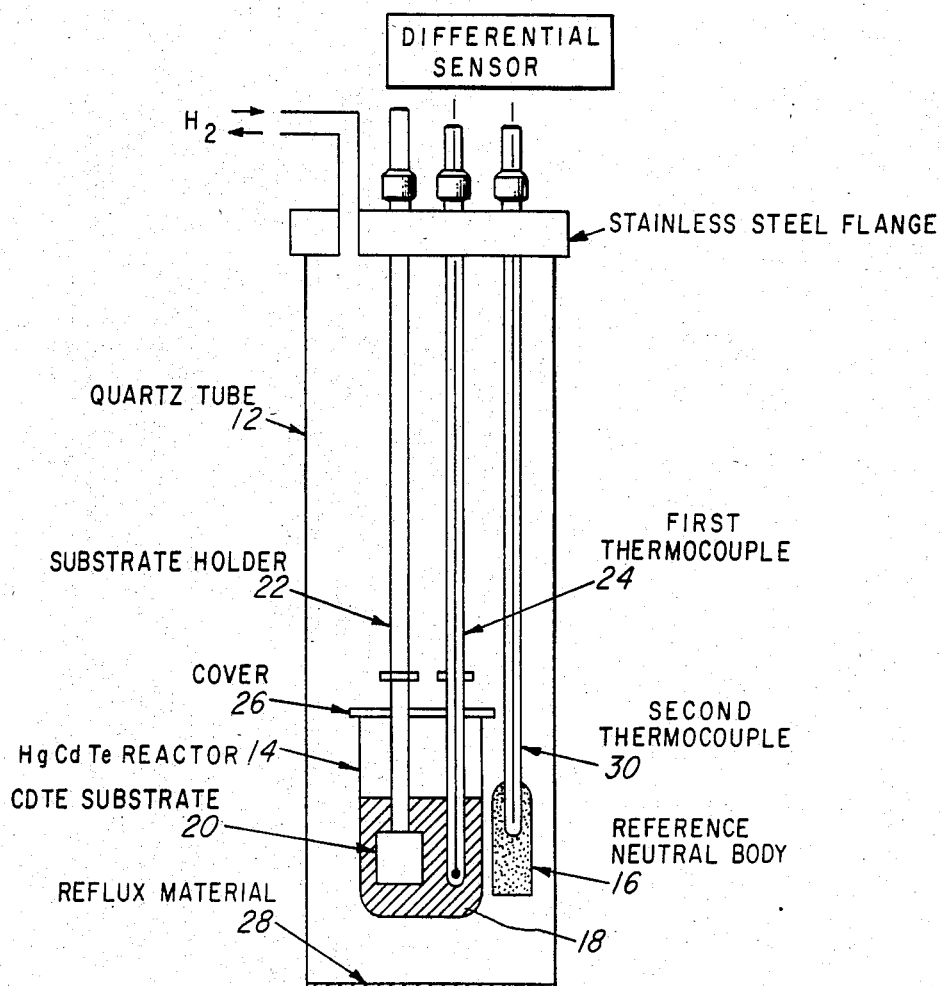
FIG. 1 shows apparatus used to practice liquid phase epitaxy of HgCdTe or similar materials according to the present invention.

FIG. 1 shows the apparatus which is used to practice the method of the present invention. Inside a sealed vessel, e.g. a quartz tube 12, are suspended a HgCdTe reactor 14 and a neutral body 16. The HgCdTe reactor 14 includes a HgCdTe melt 18, a CdTe substrate 20 suspended by a substrate holder or support 22, and a first thermocouple 24. Note that the reactor includes a cover 26, which is provided to prevent reflux material 28, i.e. liquid mercury which has been condensed by cooler portions of the quartz tube 12, from falling into the reactor 14. A second thermocouple element 30 is provided in the neutral body 16, and the differential voltage between thermocouples 24 and 30 is sensed to provide a DTA measurement of transformation points of the melt 18.

FIG. 2 shows a sample DTA plot, such as would be used to actually monitor the transformations of a HgCdTe melt. Note that two curves are shown, one during the heating cycle and one during the cooling cycle. The vertical offset between these two curves is simple due to the different heat-flow characteristics of the neutral body 18 and of the whole HgCdTe reactor 14. This offset is of no significance, since the crucial information is provided by the transformation points A through D (which are indicated on the graph), where sharp changes in the curve occur. While the vertical axis of the graph (labelled Delta T) comes from measurement of the voltage generated between thermocouple 24 and thermocouple 30, the horizontal axis (temperature) is simply measured directly by thermocouple 24.

During the heating curve, the transformation points of the DTA curve will show the solidus and liquidus temperatures of the actual melt 18 in the reactor. Thus, in the sample curves of FIG. 2, transformation point A shows a solidus temperature of 413 degrees C., and transformation point B shows a liquidus temperature of 585 degrees C. The liquidus temperature of the melt shown is low (as compared with a stoichiometric composition), because a tellurium-rich melt is used specifically to lower the liquidus temperature. By varying the Te percentage, the liquidus temperature of the melt can be roughly selected to be as low as about 400 degrees C. Non-stoichiometric Hg-rich melts can also be used to attain a lower liquidus temperature, but these melts cause a very high vapor pressure of Hg. Thus, a sample composition used for the melt would be approximately $Hg_{0.20}Cd_{0.006}Te_{0.79}$. The mercury to cadmium ratio of this mixture is much higher than the 4-to-1 or 5-to-1 ratio which is desired in the final epitaxial layer. However, incongruent solidification causes the Cd to be preferentially deposited, as the epitaxial layer is grown. Of course, the actual composition of the melt 18 will differ considerably from the composition of the charge originally placed in reactor 14, since, as noted above, mercury distillation effects are of major importance, and unpredictably alter the composition of the melt 18.

At the liquidus temperature of the desired stoichiometric alloy which is to be deposited, e.g. $Hg_{0.8}Cd_{0.2}Te$, (approximately 750 degrees C.), the vapor pressure of mercury is dozens of atmospheres. Thus previous attempts to maintain an equilibrium pressure of mercury vapor above a stoichiometric melt in the HgCdTe reactor have sometimes resulted in disastrous explosions, and such a very high mercury pressure also presents high danger of a large escape of extremely poisonous vapor into the laboratory. The use of a tellurium-rich melt, which has a significantly lower liquidus temperature, greatly alleviates this problem. Since the Te-rich melt is non-stoichiometric, it has a strong affinity for Hg. Thus vapor-phase mercury has an increased probability of returning to the melt, and the equilibrium partial pressure of mercury at the melt temperature is reduced to only about 0.1 atmosphere. The preferred embodiment of the invention therefore maintains an equilibrium pressure of mercury within the reactor 14. An $H_2$ buffer gas at around one atmosphere is also present in quartz tube 12, to avoid oxidation.

A mercury vapor pressure gradient (and distillation cycle) also occurs between the hot and cold portions of the tube 12, but the transport of mercury in this distillation cycle may optionally be retarded by including a high pressure of a buffer species.

Thus, the DTA curve of FIG. 2 shows that the liquidus point of the melt being tested is 585 degrees C. However, the cooling curve in FIG. 2 shows that the liquidus transition is only achieved at 501 degrees C. (supercooling of 84 degrees), and the solidus transition is only achieved at 297 degrees C. (supercooling of 116 degrees C.). (Transformation points E and F are simply due to a reference body used in preparing these curves, which contained metallic indium which has a melting point of 156 degrees C. However, the preferred neutral body 16 is copper encased in a silica ampoule.) The possibility of such large supercooling means that extremely rapid (and probably unstable) epitaxial growth will occur when the substrate is immersed in a melt which has been supercooled to such a degree. In particular, heterogeneous nucleation, and a disastrous loss of control over melt composition, will occur when supercooling is excessive.

Thus, the preferred way to practice the method of the present invention is therefore as follows. A melt containing approximately 80% tellurium and 20% mercury, together with a small amount (e.g. 0.6%) of cadmium is enclosed in a reactor, together with a first thermocouple element 24. The first thermocouple element 24 is differentially sensed with respect to a second thermocouple element 30 which is placed in a neutral body 16. The neutral body 16 preferably comprises copper sealed in a quartz ampoule. A CdTe substrate 20, supported by a substrate holder 22, is also positioned inside the reactor 14, but is initially held above the surface of the melt 18 as in FIG. 3A. The reactor is then heated, until the differential output across thermocouples 24 and 30 shows its second transformation point at the liquidus temperature of the actual melt 18. Thermocouple 24 directly reads out the melt temperatures at which the transformations differentially sensed by thermocouples 24 and 30 occur. The direct reading from thermocouple 24 is noted when the differential sensors of thermocouple pair 24 and 30 indicate that the liquidus transition has been reached. Heating continues to around 10 degrees C. above the liquidus, at which point the melt is stirred at constant temperature for some time to assure homogenization. The reactor is then cooled to a degree or two above the measured liquidus temperature. The furnace temperature is then adjusted so that the whole system cools slowly, at about 0.02 degrees per minute. When the reactor has cooled to about 1 degree C. above the measured liquidus temperature, the substrate holder 22 is lowered so that the CdTe substrate 20 is immersed in the melt. The temperature is continually lowered at the same rate, and after the temperature has been lowered to about 2 degrees C. below the liquidus temperature, the substrate holder 22 is raised to withdraw the substrate 20. Note that the substrate 20 is positioned on edge, so that gross defects will not be caused by unwanted droplets of melt adhering to the substrate.

FIGS. 3a-3c show the structure and operation of the substrate holder 22 in greater detail. The CdTe substrate 20 is tilted as it enters the solution, held horizontal while LPE growth occurs, and then re-tilted and withdrawn vertically. The horizontal growth position helps to avoid convection induced by compositional gradients during growth. In addition, the whole substrate holder is rotated on its axis during growth, so that the melt is stirred, and so that axial nonuniformity is avoided. The vertical withdrawal position minimizes unwanted melt retention.

The substrate holder 22 includes a tilting support 34, which is pivotably attached to housing 32. The tilting support 34 is preferably made of fused quartz, or of other inert material having a density less than 6.8. Thus, the buoyancy of the tilting support 34 will exert an upward force when immersed in the melt, thereby moving the substrate 20 and tilting support 34 into the horizontal position. When the substrate 20 is to be withdrawn from the melt 18, the concentric inner member 36 of the substrate holder is movably protruded, pressing the tilting support 34 into a vertical position. Inner member 36 of housing 32 also includes paddles 38, so that it is protruded and rotated, to stir the melt, before the substrate 20 is ever immersed.

A slight meltback is induced in the substrate, by immersion at a temperature 1 degree above the liquidus. However, the thickness of substrate thus removed is insignificant in comparison to the thickness of the substrate itself (e.g. about 1 mm), and this meltback step does assist in providing a good surface for the subsequent LPE crystal growth to start from. The substrate 20 is removed from the melt 18 at about 2 degrees below the liquidus temperature, since further supercooling risks causing unstable growth. The reactor and substrate are then cooled to room temperature, and the substrate will be found to have grown about a 20 micron thickness of HgCdTe. The as-grown layer will normally be p-type, and a subsequent mercury anneal is used to generate n-type material.

Preferably, the substrate is cut on a (111)-cadmium directed orientation, but other orientations could also be used, although less desirable results might thereby be achieved.

A particular advantage of the present invention is that successive substrates can be immersed in the same melt for LPE growth, and only a narrow range of thermal cycling is required. To redetermine the actual liquidus temperature of the melt, the melt need only be cooled until heterogeneous nucleation occurs, and then gradually raised through the liquidus temperature to ascertain the transformation point. In addition, redetermination of the liquidus is not always necessary after every LPE cycle, since the liquidus change per cycle for a particular system can be estimated from experience.

In addition, the method of the present invention is not only applicable to slow-programmed-cooling methods, as discussed above, but may also be used to monitor and control isothermal or mixed processes (i.e. including both programmed cooling and isothermal stages), with similar advantages.

The presently preferred embodiment uses the dipping method of LPE, but of course other methods (e.g. tipping or slider boat) could also be used.

For example, if isothermal growth is to be used, the degree of supercooling must be carefully controlled. If the degree of supercooling is too small, the rate will be exceedingly slow, due to the competing mechanism of heterogeneous nucleation. In particular, where a meltback stage is used before the isothermal growth period, misestimation of the liquidus temperature may cause too large an amount of material to be removed by meltback, or conversely, may not be sufficient to remove the undesired formations. Finally, if the growth temperature is erroneously set too far below the liquidus temperature, unstable growth, widely variant alloy compositions, and poor surface conditions will result.

Finally, this invention has been described with particular reference to the HgCdTe system, since HgCdTe is a preeminent example of an electronic material of importance which has incongruent solidification. However, the present invention can also be advantageously applied to other electronic materials which have the difficulty of incongruent solidification, particularly where high vapor pressures make precise compositional control difficult. For example, the present invention may be applied to HgCdSe and to numerous III-V and IV-VI ternary and quaternary alloy systems.

I claim:

1. An apparatus for HgCdTe liquid phase epitaxial growth on a substrate, comprising:
    (a) a sealed vessel;
    (b) reactor means within said sealed vessel, for containing an HgCdTe melt; and
    (c) substrate holder means, extending within said sealed vessel, for holding a substrate and immersing said substrate in a melt within said reactor means, said substrate holder means including a housing for pivotally securing a substrate support thereto, said substrate support for securing the substrate thereto and in a normally vertical position, and means in said housing and axially movable relative thereto for rotating said support to a horizontal position; and
    a neutral body adjacent to said reactor within said vessel;
    first and second temperature sensing elements, said first temperature sensing element being within said reactor, and said second temperature sensing element being within said neutral body;

means for differentially sensing said first and second temperature sensing elements.

2. An apparatus as set forth in claim 1 wherein said substrate support has a density less than about 6.8.

3. An apparatus as set forth in claim 2 wherein said substrate support is formed of fused quartz.

4. An apparatus as set forth in claim 3 wherein said housing is in the form of a sleeve and said means for rotating is a shaft movable axial of and within said sleeve to rotate said substrate holder to said horizontal position.

5. An apparatus as set forth in claim 4 further including a paddle at the end region of said shaft immersed in said melt.

6. An apparatus as set forth in claim 2 wherein said housing is in the form of a sleeve and said means for rotating is a shaft movable axial of and within said sleeve to rotate said substrate holder to said horizontal position.

7. An apparatus as set forth in claim 6 further including a paddle at the end region of said shaft immersed in said melt.

8. The apparatus of claim 1, wherein said sealed vessel comprises a quartz tube.

9. The apparatus of claim 1, wherein said reactor means further comprises a cover disposed on said reactor means to exclude falling droplets of mercury.

10. An apparatus as set forth in claim 1 further including a neutral body adjacent to said reactor within said vessel, the temperature sensing elements being first and second thermocouple elements, said first thermocouple element being within said melt and said second thermocouple element being within said neutral body and means for sensing said first thermocouple and for differentially sensing said first and second thermocouple elements.

11. An apparatus as set forth in claim 1 wherein said substrate support is formed of fused quartz.

12. An apparatus as set forth in claim 11 wherein said housing is in the form of a sleeve and said means for rotating is a shaft movable axial of and within said sleeve to rotate said substrate holder to said horizontal position.

13. An apparatus as set forth in claim 12 further including a paddle at the end region of said shaft immersed in said melt.

14. An apparatus as set forth in claim 1 wherein said housing is in the form of a sleeve and said means for rotating is a shaft movable axial of and within said sleeve to rotate said substrate holder to said horizontal position.

15. An apparatus as set forth in claim 14 further including a paddle at the end region of said shaft immersed in said melt.

* * * * *